United States Patent
Balch et al.

(10) Patent No.: US 8,020,138 B2
(45) Date of Patent: Sep. 13, 2011

(54) VOLTAGE ISLAND PERFORMANCE/LEAKAGE SCREEN MONITOR FOR IP CHARACTERIZATION

(75) Inventors: Bruce Balch, Saranac, NY (US); Nazmul Habib, South Burlington, VT (US); Susan K. Lichtensteiger, Essex Junction, VT (US); Daniel L. Stasiak, Austin, TX (US); Richard A. Wachnik, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 646 days.

(21) Appl. No.: 12/131,476

(22) Filed: Jun. 2, 2008

(65) Prior Publication Data

US 2009/0295402 A1 Dec. 3, 2009

(51) Int. Cl.
*G06F 17/50* (2006.01)
(52) U.S. Cl. ........................ 716/136; 716/133
(58) Field of Classification Search .................. 716/1, 4, 716/5, 133, 136; 713/300, 320, 323, 324, 713/340; 714/731, 814; 324/537, 765
See application file for complete search history.

(56) References Cited

U.S. PATENT DOCUMENTS

| 5,200,638 A | 4/1993 | Kida et al. |
| 7,305,639 B2 | 12/2007 | Floyd et al. |
| 2006/0190744 A1* | 8/2006 | Blanco et al. ................. 713/300 |
| 2008/0106327 A1* | 5/2008 | Meijer et al. ................. 327/540 |
| 2008/0129324 A1* | 6/2008 | Pastel ............................ 324/765 |

* cited by examiner

*Primary Examiner* — Vuthe Siek
(74) *Attorney, Agent, or Firm* — Wood, Herron & Evans, LLP

(57) ABSTRACT

A method is provided for characterizing performance of a chip having at least one voltage island and at least one performance screen ring oscillator (PSRO). An on-chip performance monitor (OCPM) is incorporated on the voltage island. Performance measurements of the voltage island are generated with only the voltage island under power. Performance measurements of the performance screen ring oscillator (PSRO) are generated with only the voltage island under power. Performance measurements of the performance screen ring oscillator (PSRO) is compared to the performance measurements of the on-chip performance monitor (OCPM) to determine a systematic offset due to the voltage island. Performance models are adjusted using the systematic offset due to the voltage island.

8 Claims, 3 Drawing Sheets

VOLTAGE ISLAND PERFORMANCE/LEAKAGE SCREEN MONITOR FOR IP CHARACTERIZATION

FIELD OF THE INVENTION

The present invention relates generally to integrated circuits and, more particularly, to methods for characterizing voltage island performance of an integrated circuit design.

BACKGROUND OF THE INVENTION

Constructing an Application Specific Integrated Circuit (ASIC) is a process that involves many variables. Some of the variables are fairly consistent for the entire manufacturing process. Some variables vary from lot to lot but are consistent across a single lot of wafers. Still other variables vary from wafer to wafer but are consistent across a chip. Finally, some of the variation can occur within a single chip.

Examples of variables that can occur on a single chip include small variations in the mask, imperfection in optical proximity correction, and etch variations. Additionally, many of these variations can occur over a very small area. Consider, for example, a string of buffers that are all placed in a row. The gates in the middle of the string all have the same structures on each side, but the gates at the ends of the string are adjacent to the different features that may cause different variations in the etching process.

The many variables involved in the manufacturing process means the gate delay of a cell on a chip is actually a Gaussian distribution with a mean and standard deviation determined by the cell design and these many variables. A randomly chosen instance of a cell on a randomly chosen chip could be running at any point within that Gaussian distribution. Fortunately, timing analysis does not need to directly verify the chip's operation at every point in the distribution. Instead, if a design is shown to work at both the best case corner and the worst case corner, it is assumed to work at any corner in between.

Signal speeds associated with integrated circuit devices may be subject to both inter-chip variation and across-chip variation. Inter-chip variation, or differing speeds among integrated circuit devices in a system, has been a noted concern in the integrated circuit industry. As a result, various techniques have been developed for determining and compensating for inter-chip variation. However, across-chip variation, or differing signal path speeds in an individual integrated circuit device, is a relatively new concern for ASIC vendors and fabricators.

In order to determine across chip variation of signal paths of an integrated circuit device, simulated timing delays of the signal paths may be modeled with the use of a timing analysis tool. In modeling signal path delays, ASIC vendors and fabricators typically provide "best-case fast" and "worst-case slow" simulated timing delay models. For example, cells in a signal path will never be faster than the best-case fast model, or slower than the worst-case slow model. The determined across chip variation factor may be added to a signal path of the integrated circuit device in various ways, which are known to those skilled in the art.

As the size and complexity of an integrated circuit device increases, the resulting magnitude of across chip variation also increases. For example, a 20×20 millimeter chip with 5000 cell rows has an increased chance of having cells in the integrated circuit device operating at different speeds. A larger chip also has an increased chance of its signal paths being affected by process, voltage, temperature (PVT) factors, which may vary across the surface of an integrated circuit device.

Commonly, in order to determine an across chip variation factor for each signal path, the timing analysis tool is run at a single worst case PVT point. However, because PVT factors vary across the integrated circuit device, using an across chip variation factor computed from a single PVT point is unduly pessimistic, and can significantly increase project time, and thus development costs. Much of the delay resulting in across chip variation depends on the distances between the cells involved; for example, there is less of a delay if the cells are close together, more if they are far apart. Assuming a worst case variation of PVT factors for purposes of fabrication, as described above, may lead to signal path delays large enough to seriously disrupt an ASIC project schedule. This becomes more challenging with ASICs containing voltage islands containing independently powered circuits.

In an ASIC test environment, test site hardware is used to build and measure circuits and to correlate ASIC models to the hardware, including models for timing (performance), dynamic power and static power. A method conventionally used to isolate the IP for measurements is to build the experimental circuits inside an independently powered voltage island on the test site chip, isolating specific circuits from the chip logic/power supply. This enables verification ensuring that timing, dynamic/static power and leakage rules are met and data is bounded by limits. Additionally, temperature and voltage sensitivities may be characterized across multiple process windows as well as characterizing voltage island performance and leakage vs. four-corner PSRO (located in each corner of a chip) mean performance over complete process window coverage ($I_{on}$, $V_T$, $L_{eff}$).

However, there is presently no way to evaluate the effects of the local environment difference inside the voltage island. Local variations in performance, voltage, temperature, and voltage island perimeter density (environment, topology) may affect the performance, power and leakage of the design. There is a need, therefore, to correlate PSRO and specific integrated circuits and/or track voltage island to chip variation.

SUMMARY OF THE INVENTION

Embodiments of the invention provide a method of characterizing performance of a chip having at least one voltage island and at least one performance screen ring oscillator (PSRO). On-chip performance monitor(s) (OCPM) are incorporated on the voltage island on the chip. The OCPMs generate performance measurements of the voltage island while only the voltage island under power. Additionally performance measurements of the performance screen ring oscillator (PSRO) are generated, again, with only the voltage island under power. The performance measurements of the performance screen ring oscillator (PSRO) are compared to the performance measurements of the on-chip performance monitor (OCPM) to determine a systematic offset due to the voltage island. Once the offset has been determined, performance models may then be adjusted using the systematic offset due to the voltage island.

In some embodiments, performance of the voltage island may be characterized using the performance measurements of the voltage island and performance models of the voltage island updated. Performance models may include models such as timing, leakage and/or dynamic power. The characterized performance to may be correlated to the hardware implementations.

In some embodiments, the chip includes four performance screen ring oscillators (PSRO) positioned at the four corners of the chip, which are used to measure across chip variation. Measurements from the on-chip performance monitors (OCPM) may reflect voltage island environment variations including IP type, topography (including perimeter density), local temperature variations, and local voltage variations. The IP type may include memories, sparse logic, dense logic, analog cores, digital cores, $V_T$ specific logic, and combinations thereof.

Characterization for leakage, in some embodiments, may include calibrating leakage calculations to performance screens, evaluating topology and density effects, and calibrating to IP types. Whereas, characterization for power, in some embodiments, may include verifying dynamic power sensitivity to process as well as calibrating to IP types. Other characterizations for other performance testing may also be employed.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

Embodiments of the invention implement product performance screen ring oscillators (PSRO) or other hardware monitor structures inside voltage islands for screening and characterization. A voltage island is a method of providing multiple voltage domains that are isolated from the on-chip voltage domain when designing or implementing integrated circuits across a chip design. Because voltage islands can be considered to be a chip within a chip, these additional monitors may result in a more accurate characterization and correlation (performance and leakage) of the chip to actual devices. Independent monitoring and modeling of the voltage island IP may assist in establishing systematic offsets due to the voltage islands that may then be incorporated into timing, leakage, and thermal models, among others, for performance prediction and minimization of yield loss due to leakage and performance. Accurate models accounting for variation due to the voltage islands may enable designers to optimize power and performance of the chip designs.

Figure 1:
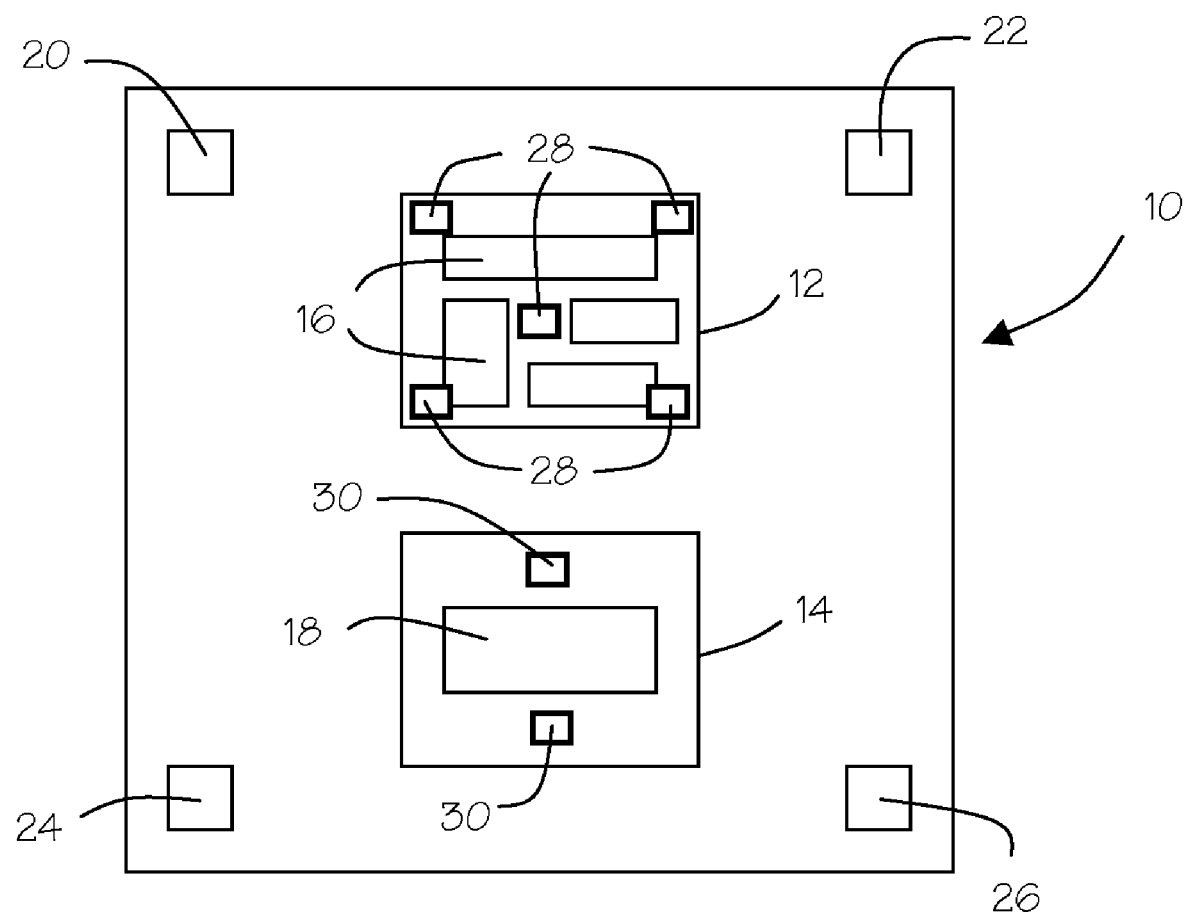
FIG. 1 is a diagrammatic representation of a chip with voltage islands.

Turning to the drawings, wherein like numbers may denote like parts throughout several views, FIG. 1 shows a chip 10 having two voltage islands 12, 14. One of ordinary skill in the art will realize that the chip 10 may contain any number of voltage islands, and the number of voltage islands is determined by the design of the macro implemented on the chip. Each of the voltage islands may characterized by different IP types such as memories, sparse logic or dense logic circuits, analog or digital cores, $V_T$ specific logic, among others. Each of these different IP types may contain different types of and densities of components 16, 18 corresponding to the IP type. Also incorporated on chip 10 are PSROs 20-26 which are used to measure across chip variation as is known in the art. As disclosed above, there is presently no method to validate the IP that is self contained within a voltage island or account for voltage island to chip variation from the four corner PSRO measurements.

One method to better characterize variations of the voltage islands is to place monitors directly on the voltage islands. Placement of the monitors is dependent on the island and the type of IP on the island. Voltage island 12 may be a fairly large island. In this situation, performance monitors 28 may be placed at the corners and center of the island 12 to better account for across chip variation on the island 12. For smaller islands, or islands with more uniform IP, such as island 14, a smaller number of performance monitors 30 may be necessary to capture the across chip variation of the island 14. Characterization for leakage may then use data from the monitors 28, 30 to calibrate leakage calculations to performance screens for leakage. The monitors 28, 30 may account for additional effects due to topology and density of the components on each of the voltage islands 12, 14, as well as calibration to the type of IP such as arrays, analog or digital cores, sparse or dense logic, etc. Additionally, dynamic power may be similarly characterized by verifying power sensitivities to the process.

Monitors 28, 30 on voltage islands 12, 14 may be implemented as PSROs or any other type of monitor that allows for automated measurements. PSROs generally are capable of screening and characterization for performance (timing) and leakage. Additional sensors may also be added for temperature sensing and monitoring, or for Voltage and IR drop monitoring. Once in place, the voltage island monitors 28, 30 may be used to correlate voltage island hardware to models for performance, dynamic power, or leakage, in an isolated environment, with the remainder of the chip not being under power. Additionally with thermal sensing, thermal effects on leakage and performance may also be better characterized and modeled. Similarly, monitors 28, 30 on voltage islands 12, 14 may be used to determine the systematic components of density related effects, such as perimeter density effects on the voltage islands.

After the data has been gathered from the process monitors 28, 30 on the voltage islands 12,14, the corner PSROs 20-26 may then be activated, while still keeping the remainder of the chip unpowered, to identify the systematic variation across the chip 10, measured at the corners, due solely to the voltage island under power. In configurations that contain multiple voltage islands, such as the example in FIG. 1 and FIG. 2, each of the voltage islands 12, 14 may be powered and characterized separately. Corner measurements may then be taken via PSROs 20-26 for each individual voltage island 12, 14. Additionally, combinations of the voltage islands 12, 14 may be powered for corner measurements with the PSROs 20-26. This characterization may be used for any of the tests required for verification on the chip 10 including timing and leakage.

Figure 2A:
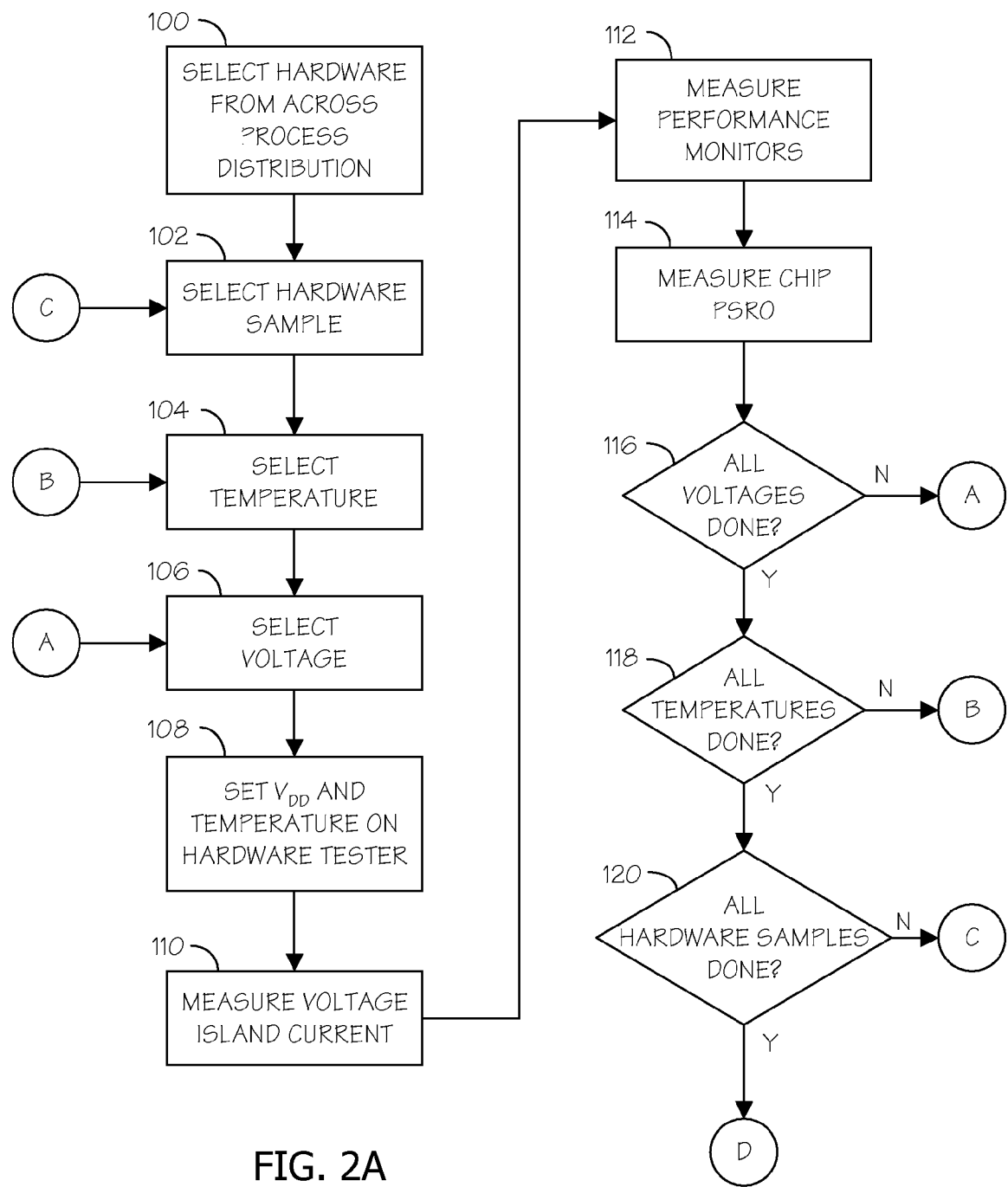
FIG. 2A is a flowchart of a process for characterizing leakage on a chip consistent with embodiments of the invention.
Figure 2B:
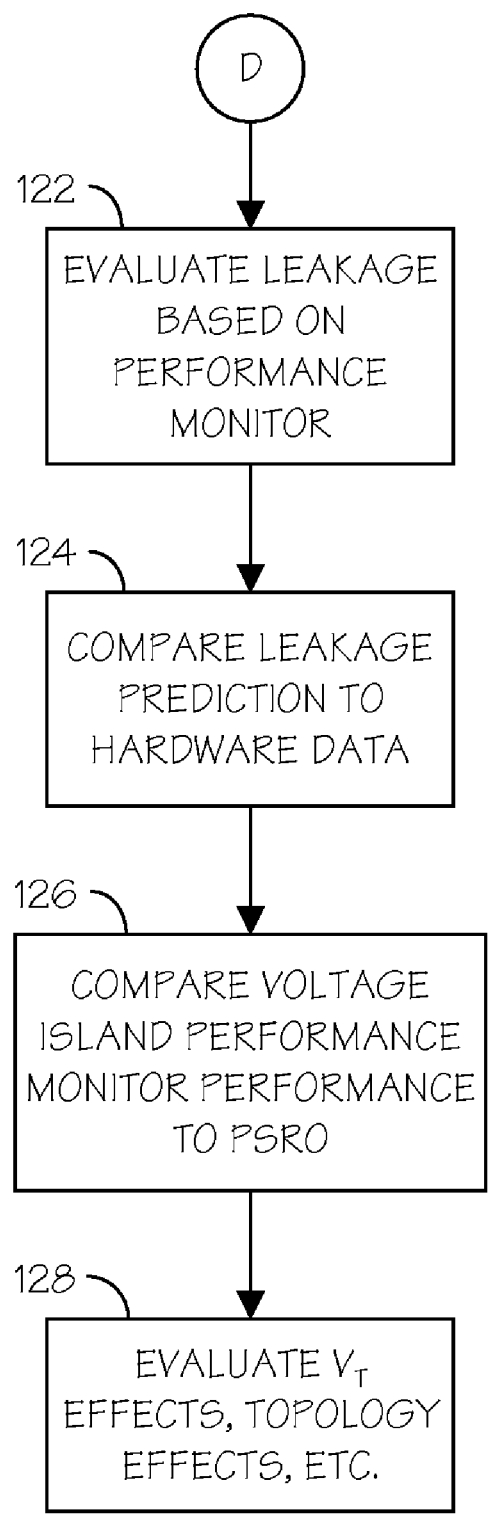
FIG. 2B is a continuation of the flowchart in FIG. 2A.

The flowchart in FIGS. 2A and 2B illustrates a method for determining leakage for a chip with at least one voltage island. Test hardware is selected from across a process distribution in block 100. Test chips on a wafer are created for best case, worst case, and nominal performance, in order to be able to test over an acceptable manufacturing space and achieve good correlation with the models. A hardware sample is selected from the test hardware in block 102. A temperature is selected in block 104 and a voltage level ($V_{DD}$) is selected in block 106 for the leakage test. The selected voltage and temperatures are then set on the hardware tester and are applied to the selected sample in block 108.

Voltage island current is measured in block 110. With only the voltage island under power (known $V_{DD}$), the current is also known. Current measurements provide the quiescent current of the voltage island when the rest of the chip is not under power. Once the current has been determined, measurements from the remaining process monitors may be acquired and stored in block 112. As disclosed above, these process monitors may provide temperature data if they are temperature monitors, timing data if they are timing performance monitors, or leakage data as in this example, among others. After the acquisition of the measurements from the performance monitors on the voltage island, the corner PSROs may be powered and across chip measurements may be acquired in block 114. These corner measurements account for across chip variation with only the voltage island(s) under power. These values may then be used to remove any systematic variation due to the voltage island from the remaining chip measurements during further testing and characterization of chip performance.

If additional test voltages remain in the testing process ("No" branch of decision block 116), then a new voltage is selected in block 106 and the process repeats. If all of the tests for voltage have been completed ("Yes" branch of decision block 116), then a check is made to determine if each of the temperatures levels have been tested. If additional temperatures remain ("No" branch of decision block 118), then a new temperature is selected in block 104 and the process repeats. If all of the tests for temperature have been completed ("Yes" branch of decision block 118), then a check is made to determine if tests for all of the hardware samples have been completed. If there are hardware samples remaining ("No" branch of decision block 120), then a new hardware sample is selected in block 102 and the process repeats for the new hardware sample.

After all of the testing has completed ("Yes" branch of decision block 120), leakage may be evaluated for the voltage island based on the collected measurements from the process monitors on the voltage island in block 122. If timing were being evaluated, delays would be evaluated for each of the data points collected during the testing process. The leakage measurements are then compared to the predicted leakage for the voltage island in block 124. Models use to predict the leakage for the voltage island may then be adjusted as necessary to better correlate the predicted leakage values to the actual measurements from testing. Similarly, if timing were being tested, the timing data would be compared to predicted timing data from timing models and if necessary, timing rules may be updated to better correlate to the measured values. Next, the measurements from the voltage island are compared to the measurements from the corner PSROs in block 126 to determine the voltage island offset. This offset may then be used in the evaluation of the additional measurements when the chip is under power in block 128. The offsets may be used to evaluate and update the prediction models for the chip. This method may be used to enable accurate chip level leakage, and accurate yield estimation where leakage screens are used. Similar models and tests may be utilized and performed for timing, voltage, and temperature conditions.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method of characterizing performance of a chip having a voltage island and at least one performance screen ring oscillator in a region of the chip not associated with the voltage island, the method comprising:
generating performance measurements of the voltage island with only the voltage island under power using a plurality of on-chip performance monitors on the voltage island;
generating performance measurements of the performance screen ring oscillator with only the voltage island under power;
comparing performance measurements of the performance screen ring oscillator to the performance measurements of the on-chip performance monitors to determine a systematic offset due to the voltage island; and
adjusting performance models for the chip using the systematic offset due to the voltage island,
wherein the performance models include timing models, leakage models, or dynamic power models, and the on-chip performance monitors are respectively located at corners of the voltage island and at a center of the voltage island to account for across chip variation on the voltage island when determining the systematic offset.

2. The method of claim 1 further comprising:
characterizing performance of the voltage island using the performance measurements of the voltage island; and
updating performance models for the voltage island.

3. The method of claim 2, wherein characterizing performance of the voltage island using the performance measurements of the voltage island comprises:
calibrating leakage calculations to performance screens;
evaluating topology and density effects; and
calibrating to IP types.

4. The method of claim 2, wherein characterizing performance of the voltage island using the performance measurements of the voltage island comprises:
verifying dynamic power sensitivity to process; and
calibrating to IP types.

5. The method of claim 4 wherein the IP type is selected from a group consisting of memories, sparse logic, dense logic, analog cores, digital cores, VT specific logic, and combinations thereof.

6. The method of claim 2, further comprising:
correlating characterized performance to hardware implementations.

7. The method of claim 1, wherein the chip includes four performance screen ring oscillators positioned at the four corners of the chip.

8. The method of claim 1, wherein the performance measurements by the on-chip performance monitors reflect voltage island environment variations selected from the group consisting of IP type, topography, local temperature variations, local voltage variations, and combinations thereof.

* * * * *